United States Patent [19]
Hein et al.

[11] Patent Number: 5,761,046
[45] Date of Patent: Jun. 2, 1998

[54] SEALED HOUSING FOR AN ELECTRICAL COMPONENT

[75] Inventors: Dierk Hein, Hanover; Andreas Teichmann, Isernhagen; Jens Gröger, Hanover, all of Germany

[73] Assignee: WABCO Vermogensverwaltungs-GmbH, Hanover, Germany

[21] Appl. No.: 572,657

[22] Filed: Dec. 14, 1995

[30] Foreign Application Priority Data

Dec. 17, 1994 [DE] Germany ............... 44 45 125.3

[51] Int. Cl.$^6$ .............. H05K 5/02; H01L 23/02
[52] U.S. Cl. .............. 361/752; 361/728; 361/758; 361/809; 361/826; 174/52.4; 439/76.2
[58] Field of Search ............. 361/728, 752, 361/753, 740, 747, 758, 759, 807, 809, 826; 174/52.2–52.4; 439/76.1, 76.2; 257/678

[56] References Cited

U.S. PATENT DOCUMENTS

| 4,811,165 | 3/1989 | Currier et al. .............. 361/386 |
| 5,253,143 | 10/1993 | Klinger et al. .............. 361/736 |

FOREIGN PATENT DOCUMENTS

| 29 49 16 | 4/1971 | Austria . |
| 33 07 654 A1 | 9/1984 | Germany . |
| 37 16 102 A1 | 11/1988 | Germany . |
| 34 16 348 C2 | 1/1991 | Germany . |
| 40 06 078 A1 | 8/1991 | Germany . |
| 90 07 236.7 | 12/1991 | Germany . |
| 41 06 453 C1 | 8/1992 | Germany . |
| 42 15 041 A1 | 11/1992 | Germany . |
| 41 26 113 A1 | 2/1993 | Germany . |
| 40 40 288 C2 | 4/1993 | Germany . |
| 43 03 908 A1 | 8/1994 | Germany . |
| WO 91/05453 | 4/1991 | WIPO . |

*Primary Examiner*—Leo P. Picard
*Assistant Examiner*—Jayprakash N. Gandhi
*Attorney, Agent, or Firm*—Meltzer, Lippe, Goldstein, Wolf & Schlissel, P.C.

[57] ABSTRACT

A housing for an electrical component which protects the electrical component sealed therein and reduces mechanical stress on the electrical component includes two housing sections which are connected to each other, a support for the electrical component located within the housing, and attachment connections for mounting the housing on a mounting point, e.g., of a motor vehicle chassis. To reduce the mechanical stress imposed upon the electrical component, and to obtain a good seal of the housing interior against dirt, etc., the two housing sections are connected to each other directly or via an intermediate piece. The housing interior is sealed by one or two seals, made from elastically or plastically deformable material, which are located between the faces of the support and the housing sections associated with them. The attachment connections are located on one of the two housing sections.

18 Claims, 1 Drawing Sheet

SEALED HOUSING FOR AN ELECTRICAL COMPONENT

FIELD OF THE INVENTION

The present invention relates to a housing for an electrical component. In particular, the housing has top and bottom housing sections which are connected to each other, a support for an electrical component with electrical connections terminals within the housing, and an attachment connection for attaching the housing to a mounting point, e.g., on a motor vehicle chasis.

BACKGROUND OF THE INVENTION

A housing of this type is known from PCT publication No. WO91/054513. This known housing has a first housing section and a second housing section which are connected to each other. A frame is clamped between the two housing sections and serves as a support for a printed circuit board. Plug-in pins formed on the frame are used to connect the printed circuit board, or electrical components placed on the printed circuit board, to an electrical component outside the housing. The frame and two housing sections are made of synthetic material. The housing interior is sealed against moisture and dirt by bonding the two housing sections to the frame or to each other using plastic welding.

The frame has flange-like formed parts to attach the housing on a mounting point, e.g., on a motor vehicle chassis. The flange-like parts, which serve as housing attachments, extend beyond the periphery of the frame.

One of the disadvantages of this known housing is that undesirable forces are transmitted to the printed circuit board and electrical components held within the conventional housing. These undesirable forces may be exerted by the fixing means, e.g., screws which go through openings in the formed parts and are screwed into the mounting point. Alternatively, the undesirable forces may be torsion or vibrational forces occurring at an assembly location. Furthermore, the screws may loosen due to the plasticity of the synthetic material used to make the housing sections.

It is therefore the object of the present invention to provide a housing of the type mentioned above, which is designed to reduce mechanical stress on an electrical component mounted, and to protect the electrical component against dirt, etc.

SUMMARY OF THE INVENTION

This and other objects are attained through a housing for an electrical component which comprises two housing sections connected to each other, a support located in the housing for supporting the electrical component therein, the support having electrical connection terminals for connection of the electrical component to an electrical device located outside the housing, and an attachment connection, located on either of the two housing sections for attaching the housing to a mounting point. A seal is located between the first housing section and the support so that the first housing section, the seal, and the support form a closed chamber in which the electrical component, is located. Illustratively, the seal is made of an elastically or plastically deformable material.

Desirably, the inventive housing also has a second seal located between the second housing section and the support. In this embodiment, the closed chamber for the electrical component is formed by the first housing section, the first seal, the support, the second seal, and the second housing section.

A particular advantage of this invention is the considerable reduction of mechanical stress, e.g., vibration, on the support. The stress reduction is due to the isolation of the support from the attachment connection, as well as the placement of a deformable seal, e.g., made of an elastic or plastic material, directly between the support and at least one of the two housing sections. This considerably reduces stress on the electrical component located in the housing and connected to the support. Furthermore, the housing chamber, which contains the electrical component, is effectively sealed off.

The height of the support and the height of the lateral wall or walls of the housing are sized so that when the housing is closed, a gap remains for receiving a seal between one housing section and a facing side of the support. The connection of the two housing sections to each other and to the support is substantially more stable in a housing according to the invention than in a housing made of a synthetic material since the housing sections are made from a metal which are connected to each other directly or via a rigid intermediary part also made of metal. Therefore, the problems which are caused by plasticity of a support made from a synthetic material held clampingly between two housing sections do not occur in the inventive housing.

Since the attachment connection is located on a mechanically stable metal housing section, it is able to transmit considerably higher attachment forces than an attachment connection provided on a support made from synthetic material as heretofore. It is therefore possible to install components in the inventive housing which considerably increase the weight supported in the housing, e.g., pneumatic or hydraulic components in addition to electrical components.

A further advantage of the inventive housing is reduced cost. This is achieved in part by eliminating costly galvanization of the housing sections, while a high degree of resistance to EMI (electromagnetic interference) is nevertheless ensured.

If electrical power components are installed in the housing, heat generated by the electrical power components must be dissipated, e.g., via a cooling body. A cooling body according to the invention need not extend outside of the housing through the support made of synthetic material. This is because the cooling body of the present invention is in contact with one of the two metal housing sections or is connected to one of them, i.e. connected to an area of one of the two housing sections which delimits the sealed chamber receiving the electrical component. Therefore, additional sealing of a passage for the cooling body is not required.

In an illustrative embodiment of the invention, at least one of the two housing sections has a sealing contour which may be in the form of a surrounding groove. The sealing contour receives the seal. Illustratively, the seal has a circular cross-section. Part of the support or frame enters into the groove.

The depth of the groove and depth of the area into which the support enters have relative dimensions such that the seal, which is located in the groove, deforms elastically when the two housing sections are connected to each other. The seal deforms to such an extent that flanks of the groove are pressed with a slight pressure, e.g., by the first housing section and the support.

In another embodiment of the invention, the sealing contour on the other housing section is shaped as a step. This step shaped sealing contour extends into a space delimited by the support.

In yet another embodiment of the invention, at least one plug-in contour is located on the support. The plug-in contour is integral with the support and extends out of the housing through an opening in a peripheral sidewall of the housing. The electrical connection terminals, which connect the electrical component located in the housing to an electronic component located outside the housing, have plug-in pins or plug-in bushings integrally formed on the support and on a reinforcing rib. The plug-in contour surrounds the plug-in pins or plug-in bushings. The reinforcement rib has window-like openings near one of the plug-in pins. The window-like openings allow inspection of the housing to be carried out from one side, without having to change the position of the housing or that of the inspection equipment.

In a further embodiment of the invention, the electrical component located in the housing has an electrically conductive contact located near the attachment means of support such as component supports located on the reinforcement rib. Illustratively, the component supports extend toward one of the two housing sections. The component supports support the electrical component. The contact is positioned in such manner relative to one of the housing sections so as to form an electrically conductive connection between the housing and the electrical component.

An embodiment of the present invention, shown in the figures, is discussed in greater detail below.

DETAILED DESCRIPTION OF PREFERRED EMBODIMENTS

Figure 1:
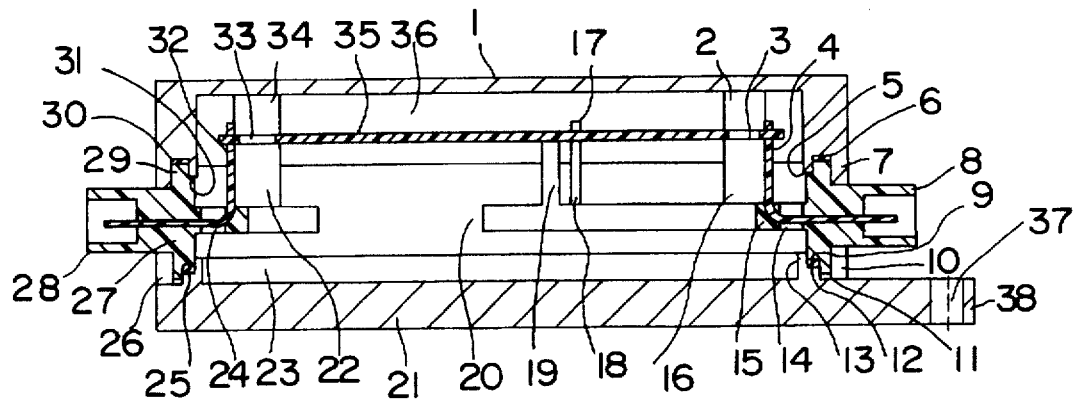
FIG. 1 shows a housing for an electrical component according to the present invention.

FIG. 1 shows a housing (21,1,7) for an electrical component according to the present invention. The housing (21,1, 7) comprises a plate-shaped first housing section serving as a bottom section (21) of the housing, and a U- or pot-shaped second housing section serving as a top section (1,7). The top section (1,7) has a lateral portion (1) located between peripheral walls or sidewalls (7). The bottom section (21) and the top section (1,7) are connected to each other by connecting devices not shown here. Illustratively, the connecting devices may be screws. The bottom section (21) is provided with a peripheral projection (23) extending parallel to the lateral portion (1) of the top section (1,7). A step (12,13) on bottom section (21) extends towards the inside of the housing (21,7).

Peripheral sidewalls (7) of the top section (1,7) extend toward the bottom section (21) and overlap the peripheral projection (23). A surface of the peripheral sidewall (7), which surface faces the bottom section (21), lies over the bottom section (21) so that the peripheral sidewall is flush with the outer edge of the bottom section (21).

A groove-like depression (6) is located in a sidewall step (5) of the peripheral sidewall (7). The projection step (12,13) of the bottom section (21) and the groove-like depression (6) of the top section (1,7) face each other. Illustratively, the housing (21,1,7) is made of metal and is rectangular.

The housing (21,1,7) includes a rectangular support, such as a frame (27), made of a synthetic material which serves as a support for an electronic component. The frame (27) has a peripheral projection serving as a reinforcement rib (15) which extends into the space delimited by the frame (27) and is essentially parallel to the bottom section (21) and to the top section (1, 7).

The reinforcement rib (15) has four sections. Each section forms one of the sides of the rectangular frame (27). Four component supports (16,22,40,46 of FIG. 2) are integral parts of the four transitional areas where the four sections merge into each, i.e., are corners of the reinforcement rib (15). As can be seen from FIG. 1, wherein only two (16,22) of the component supports are shown, free ends of the component support extend toward top section (1,7). Each of the component supports (16,22) has a stepped area (3) or (33) at its free end. The component supports (16) and (22) serve as an underlay for the electrical component, which may be printed circuit (35), for example.

The printed circuit (35) has passage openings at its four corners by means of which it is installed on the stepped areas (3) and (33) of the free end of the component supports (16) and (22). Projections (2) and (34) are provided in the top section (1, 7). The top projections (2) and (34) extend towards the component supports (16) and (22), and align with the free ends of component supports (16) and (22).

The height of the stepped areas (3) and (33) of the component supports (16) and (22) is less than the thickness of the printed circuit (35). The axial or cross sectional dimension of the projections (2, 34), and the component supports (16,22), are sized to permit holding the printed circuit (35) between the component supports (16, 22) and projections (2, 34).

The projections (2) and (34) may be provided with threaded pocket bores extending in their longitudinal direction. Passage bores, which are coaxial with the pocket bores of the projections (2) and (34), are then provided in the component supports (16) and (22).

Screws may be inserted into the passage bores of the component supports (16) and (22) from passage bore openings which are away from the projections (2) and (34). These screws are screwed into the threaded pocket bores of the projections (2) and (34). In this manner, the frame (27) is attached to the top section (1,7) of the housing (21,1,7) by means of connection elements, such as the screws.

The supports (16,22) and the projections (2,34) serve as supports for the support (27) bearing the electrical component.

In the vicinity of the passage openings of the printed circuit (35), an electrically conductive medium, such as solder, is applied. The solder provides an electrical connection from the printed circuit (35) to the projections (2, 34) of the lateral portion (1) of the top section (1,7) of the housing (21,1,7). In this manner a low-cost connection between the printed circuit (35) and housing (21,1,7) is achieved.

Spacers (19) are provided to assist in automated installation and soldering of the printed circuit (35) between the component supports (16, 22) and the projections (2, 34). Spacers (19) extending in the same direction as the supports (16) and (22) are located on the peripheral projection (23). Spacers (19) prevent deformation of the printed circuit (35) during the soldering process.

Also, elastically deformable projections (18) extending from reinforcement rib (15) hold the printed circuit (35) against the frame (27) during soldering. The deformable projections (18), which extend in the same direction as the spacers (19), have latches (17) which overlap and hold the printed circuit (35).

A frame step (9,11) on the side of the frame (27) faces towards the bottom section (21). The frame step (9,11) is across from the step (12,13) of the bottom section (21). The frame step (9,11) acts as a first sealing contour of the frame (27) while the step (12,13) acts as a sealing contour of the bottom section (21). The frame step (9.11) and the step (12.13) face each other and delimit a gap which receives a first sealing ring (25).

The frame (27) and the peripheral projection (23) of the bottom section (21) as well as the steps (9.11) and (12.13) are arranged so that the frame (27) is centered on the bottom section (21). This is achieved by extending the leg (11) of the step (9.11) toward the bottom section (21) so that the leg (11) overlaps the outer side of the projection (23). In addition, the leg (13) of the step (12.13) on the bottom section (21) extends toward the top section (1.7) so as to overlap the inside of the frame (27).

A second frame step (29.31) is provided on the side of the frame (27), which faces towards the top housing section (1.7). The second frame step (29.31) is located on the inner side of the frame (27). The leg (29) of the second frame step (29.31) extends parallel to the sidewall (7) of the top section (1.7) of the housing (21.1.7). The leg (29) extends into the groove-like depression (6) of the top housing section (1.7).

A gap which receives a second sealing ring (30) is delimited by the leg (29) of the step (29.31) and the walls of top section (1.7) which delimit the groove-like depression (6). The top section (1.7) may also be centered from the outside of the frame (27). In such case, the projection of peripheral sidewall (7) on the outside of leg (29) may be omitted. The groove-like depression (6) in the sidewall (7) of the top section (1.7) must then be made wider.

The height of the frame (27) is such that when the housing (21.1.7) is closed, two gaps receiving the seals (30) and (25) remain. One gap is between the bottom of the groove-like depression (6) of the top section (1.7) and an opposing surface of the frame (27). Another gap is between the step (12.13) and the surface of the leg (9) of the frame step (9.11). Alternatively, instead of two gaps, only one gap may be present.

This ensures that when the top section (1.7) and the bottom section (21) of the housing (21.1.7) are connected to each other, large forces are not applied to the frame (27), even when the housing (21.1.7) is mounted on an assembly site. Only the two seals (30) and (25), which may be O-rings, are installed under stress. The seal (30) is installed between the frame (27) and the top section (1.7) of the housing (21.1.7), while the seal (25) is installed between frame (27) and the bottom section (21) of the housing (21.1.7).

Dome-shaped plug-in contours (8) and (28) extend away from the frame (27) and are an integral part of the frame (27). These contours extend out of the housing (21.1.7) through openings (10) and (26) in the sidewall (7) of the top section (1.7). Plug-in pins (4) and (32) are integral parts of the frame (27) and of the reinforcement rib (15). The plug-in pins (4) and (32) are in the vicinity of the plug-in contours (8) and (28) and extend into the dome-shaped plug-in contours (8) or (28).

Portions of the plug-in pins (4) and (32) located within the housing (21.1.7) are bevelled near the reinforcement rib (15) in the direction of the top section (1.7). In the vicinity of the plug-in pins (4) and (32), the reinforcement rib (15) has window-like openings (14) and (24). These window-like openings (14) and (24) are used to access a portion of each of the plug-in pins (4) or (32) when the top section (1.7) or bottom section (21) of the housing (21.1.7) is removed.

The bevelled portion of each plug-in pin (4) or (32) extends through a passage opening in the printed circuit (35), which passage opening is designed to accept this bevelled portion. The bevelled portion of each plug-in pin (4) or (32) is electrically connected to a strip conductor via a conductive element.

The size of the printed circuit (35) may be such that when the printed circuit (35) is installed, it does not completely cover the window-like openings (14) and (24) in the reinforcement rib (15). This provides access to the plug-in pins (4) or (32) by a testing device, for example, from both sides of the frame (27).

The reinforcement rib (15) of frame (27) is provided with an opening (20) through which a cooling body (not shown) extends. The cooling body is located on the bottom section (21) of the housing (21.1.7) and extends through the opening (20) in the direction of the printed circuit (35). The size of the cooling body is such that it presses against a metallic part of a power module installed on the printed circuit (35). Thus, the cooling body acts as a heat sink.

The housing interior constitutes a sealed chamber (36) of housing (21.1.7). The sealed chamber (36) consists of the space directly between top housing section (1.7) and frame (27), and between the bottom housing section (21) and frame (27). The sealed chamber (36) contains electrical components, such as the printed circuit (35). A direct seal between the top housing section (1.7) and the bottom housing section (21) is no longer required. This is because the chamber (36) is sealed and because the plugs, i.e., the plug-in contours (8.28) and plug-in pins (4.32), are an integral part of the frame (27).

Attachment connections (37.38) attach the housing (21, 1.7) to a mounting point. The attachment connections (37, 38) are located on the bottom housing section (21). Projections (38) of connections (37.38) extend laterally away from the housing (21.1.7). These projections (38) are provided with a passage opening (37) to receive an attachment device such as a screw. For simplicity, only one attachment connection is shown.

Additional projections, serving as attachment connections, may be provided on the top housing section (1.7) as well as on the bottom housing section (21). Similarly, attachment connections may be formed by a passage opening going through the two housing sections. In this case, projections (38) may be omitted.

Figure 2:
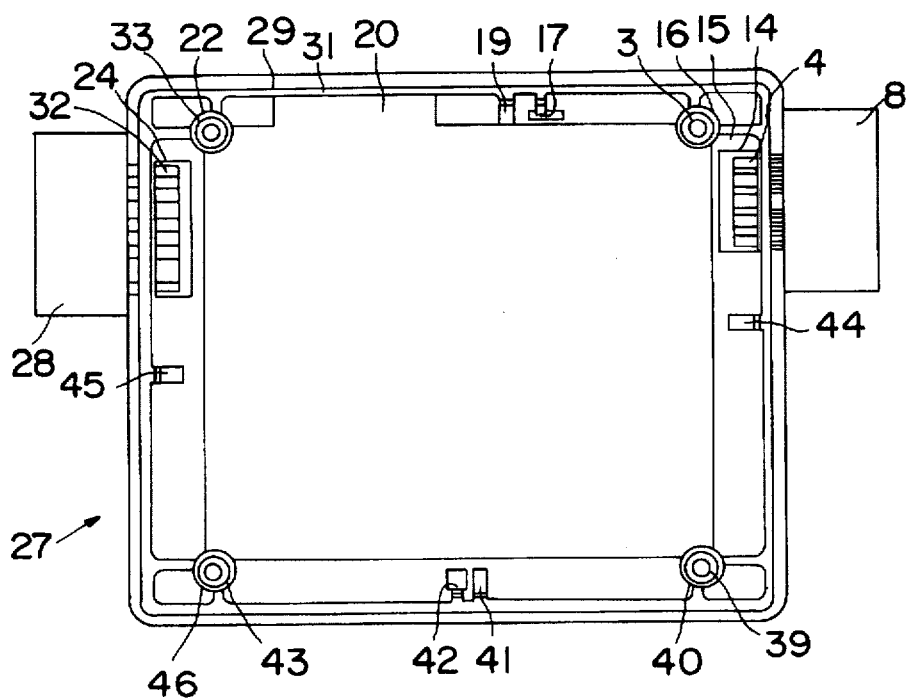
FIG. 2 shows a top view of the frame of the housing shown in FIG. 1 according to the present invention.

FIG. 2 shows a top view of the frame (27) described above. For clarity, components which are identical with components of FIG. 1 have the same reference numbers.

As mentioned above, the frame (27) is rectangular and has a peripheral reinforcement rib (15) extending inward which is integral with the frame (27). The reinforcement rib (15) has four sections merging into each other, where each section is associated with one leg of the frame (27).

The four component supports (16,22,40,46) are integral with the reinforcement rib (15). The four component supports (16,22,40,46) are located at the four transitions, i.e., corners, of the reinforcement rib (15). At their free ends, the component supports (16,22,40,46) have stepped areas (3,33, 39,43), respectively, which are aligned with passage openings of the printed circuit (35).

FIG. 2 shows the window-like openings (14,24) which are made in the reinforcement rib (15) near the plug-in pins (4,32). To simplify an extrusion coating process, the plug-in pins (4) or (32) of each plug are connected to each other by ridges not shown here. The ridges are removed by a punch-out tool introduced through the window-like openings (14, 24) after completion of the frame (27).

Over-pressure on the printed circuit (35) during soldering is prevented by means of spacers (19,41,44,45). The flexible projections (18) from reinforcement rib (15) have latches (17,42), as mentioned above, to hold the printed circuit (35) on the frame (27) during the soldering process or during assembly.

One of the two housing sections, preferably the bottom housing section (21), may be part of the housing or housing section of a device such as, e.g., an electrically or electromagnetically actuated control valve. In this case, merely the frame (27) and the top housing section (1,7) are required to complete the inventive housing. The top housing section (1,7) may be pre-assembled and already connected to the frame (27). Thus, to complete the inventive housing (21,1, 7), the top housing section (1,7), which is pre-assembled with the frame (27), is then placed upon the device area constituting the bottom housing section (21) and connected thereto.

The housing and frame can of course also have a configuration other than a rectangular one, such as, e.g., a polygonal, circular, or oval form. Between the first housing section (21) and the second housing section (1,7), an intermediary piece may be installed. The intermediary piece serves as a spacer and may be made of a rigid material. The two housing sections are then connected to each other via this intermediary piece. In this case, the sides of the two housing sections, which sides face the intermediate piece, press against the intermediary piece.

The following are some significant features of the invention. A first significant feature is that the frame is located in the housing. A second significant feature is that the space delimited by the frame is sealed between the frame and the two housing sections. A third significant feature is that the height of the frame and the height of the lateral wall or walls of the housing are sized so that the two housing sections press against each other with their faces towards each other, or towards an intermediate piece placed between the two housing sections, so that a gap remains which receives a seal.

With the exception of the portion of the plug-in pin or pins emerging from the housing, the electrical component supported by the frame is located within the chamber of the housing which is enclosed by the frame, the two housing sections and the two seals. The electrical component is considered located within the housing chamber, which is delimited by the frame, even if it extends beyond the height of the frame, i.e., even if the electrical component extends beyond the frame in the direction of the bottom part and/or the cover of the housing.

Instead of plug-in pins, it is of course also possible to provide plug-in bushings which are integral with the frame and with the reinforcement rib.

The electrical component may be a printed circuit, as described. However it may also be a connector for electrical circuits or any other electrical or electronic device.

Good grounding connection is easily established, thus ensuring good EMI protection of the electrical component in the housing. This is due to the housing being made of metal and the electrical component being connected to the housing via an electrically conductive element.

The contours of the seals between the frame and the housing sections may be configured in the form of steps. These steps include raised or depressed areas on one component, and mating depressed or raised areas on the other component. The raised area of one component, e.g., the frame, mates with the depressed area of the other component. The contact surfaces for the seals may be flat, convex or concave.

It is especially advantageous if the sealing contour on one component is in the form of a groove-like depression and the sealing contour on the other component is in form of a raised area which enters the depression. Alternatively, the sealing contour on both components may be in the form of steps which are placed in such a manner relative to each other that they delimit a space which receives a seal.

It is also possible to design the support for the electrical component in the form of a plate or in the form of a frame provided with a bottom. All that remains to be done in such case is to provide a seal between the side of the support bearing the electrical component and the housing section facing this side. The enclosed chamber in which the electric component is installed is then formed by the side of the support bearing the electrical component, by the seal, and by the housing section facing that side of the support.

If the frame is not provided with a bottom part, a seal must be provided between each of the two frame faces, which face away from each other, e.g., top and bottom faces, and the housing sections facing the respective frame faces.

It is a particular advantage of the latter embodiment that the support of the electrical component is supported between two elastic components, i.e., the two seals, so that the support and the electrical component are effectively protected from mechanical stresses (e.g., vibrations).

Such protection is of course also provided to a limited extend if an elastic component, i.e., a seal, is installed only between one side of the support and the housing section facing this side. In that case, the means used to support the support on the other housing section is preferably made of an elastically deformable material, e.g., spring elements made of metal, synthetic material or rubber.

If the seal or seals are elastically deformable, they perform dual functions: a support function as an elastic bearing element, and a sealing function.

The seal or seals may also be in the form of elastically or plastically deformable projections on the face of the support associated with one of the housing sections. Alternatively, the seal or seals may also be elastically or plastically deformable projections on the side of the housing section which is associated with one face of the support.

According to the invention, it is also possible to place the seal or seals between housing section or sections and a support. In this case, one side of the seal or seals presses against the outer circumference of the support, while the other side presses against the side of the wall of the housing section which is facing this circumference of the support.

Preferably, the seal or seals are made from an elastically deformable material, but they also can be made from a plastically deformable material, such as, from a foamed synthetic material.

The above-described embodiment of the present invention is intended to be illustrative only. Numerous alternative embodiments may be devised by those skilled in the art without departing from the spirit and scope of the following claims.

We claim:

1. Housing for an electrical component, comprising
a first housing section and a second housing section which are connected to each other;
a support for supporting the electrical component within the housing, said support having electrical connection terminals for electrically connecting the electrical component to an electrical device located outside the housing;
an attachment connection on one of said first and second housing sections for mounting the housing on a mounting point; and
a first scal located between the fist housing section and the support, said seal being made of a deformable sealing material;

wherein the first housing section, the first seal and the support constitute a closed chamber for the electrical component, and wherein the height of the support and the height of lateral walls of the housing are dimensioned so that when the first and second housing sections are connected to each other, a first gap which receives said first seal is formed between said first housing section and said support.

2. The housing of claim 1 wherein said first housing section and said support include a first sealing contour, said first seal being received within said first gap located within said first sealing contour.

3. The housing of claim 2 wherein a second gap which receives said second seal is formed between said second housing section and said support.

4. The housing of claim 3 wherein said second housing section and said support include a second sealing contour, said second seal being received within said second gap located within said second sealing contour.

5. The housing of claim 4, wherein the first sealing contour is formed by a first surface of the support facing the first housing section and a groove-like depression facing said first surface provided on a side of a step of a sidewall of the first housing section.

6. The housing of claim 5, wherein the second sealing contour is formed by a step of the second housing section extending towards said support, and a step on a second surface of said support extending towards said second housing section.

7. The housing of claim 6, wherein the first housing section and the support are sized so that said sidewall of the first housing section overlaps the outside of the support; and wherein a peripheral projection of the second housing section and the support are sized so that the support overlaps the outside of a leg of said step of said second housing section.

8. The housing of claim 7 wherein said groove-like depression and said first surface of said support delimit said first gap, and wherein said step on said second housing section and said step on said support delimit said second gap.

9. The housing of claim 8 wherein said first housing section is U-shaped in cross-section, said lateral sidewall extends towards said support and includes a step having said groove-like depression, said support including a second step, a leg of said second step extending into said groove-like depression of said first housing section.

10. The housing of claim 1, wherein the support comprises a frame with a peripheral reinforcement rib, said peripheral reinforcement rib extending away from the support into a space delimited by the support.

11. The housing of claim 10 further comprising component supports located on the reinforcement rib, said component supports extending towards one of the first and second housing sections, for supporting the electrical component.

12. The housing of claim 11, further comprising an electrical connection between said first housing section and said electrical component.

13. The housing of claim 12 wherein said electrical connection comprises projections located in the first housing section across from said component supports, the heights of said projections and said component supports being sized so that they press against each other and form said electrical connection.

14. The housing of claim 13, wherein the electric component is a printed circuit having openings through which the printed circuit is pushed on stepped areas of the component supports.

15. The housing of claim 1 further comprising at least one plug-in contour located on the support, and being integral with the support, said plug-in contour extending out of the housing through an opening in a peripheral sidewall of the housing;

a plug-in pin which is integral with the support and a reinforcement rib, the plug-in pin extending with one end into said closed chamber and with its other end into a space surrounded by said plug-in contour; and at least one opening in said reinforcement rib in the vicinity of the plug-in pin through which said plug-in pin is accessible.

16. The housing of claim 15, wherein said plug-in pin is bevelled towards the electrical component.

17. The housing of claim 1, wherein said first housing section or said second housing section constitutes a housing section of an apparatus.

18. Housing for an electrical component comprising a first housing section and a second housing section which are connected to each other;

a support for supporting the electrical component within the housing, said support having electrical connection terminals for electrically connecting the electrical component to an electrical device located outside the housing;

an attachment connection on one of said first and second housing sections for mounting the housing on a mounting point; and a first seal located between the first housing section and the support, said seal being made of a deformable sealing material, wherein the first housing section, the first seal and the support constitute a closed chamber for the electrical component, and wherein the height of the support and the height of lateral walls of the housing are dimensioned so that when the first and second housing sections are connected to each other a first gap which receives said first seal is formed between said first housing section and said said housing filter comprising a second seal located between the second housing and the support, said second seal being made of a deformable sealing material, wherein the first housing section, the first seals the support, the second seal, and the second housing section constitute said closed chamber for the electrical component.

* * * * *